April 10, 1951 P. H. REEDY 2,548,819

TUNING DEVICE

Filed Aug. 8, 1945 2 Sheets-Sheet 1

INVENTOR
PAUL H. REEDY
BY William D. Hall
ATTORNEY

INVENTOR
PAUL H. REEDY
BY William D. Hall
ATTORNEY

Patented Apr. 10, 1951 2,548,819

UNITED STATES PATENT OFFICE 2,548,819

TUNING DEVICE

Paul H. Reedy, New York, N. Y., assignor to the United States of America as represented by the Secretary of War Application August 8, 1945, Serial No. 609,646

3 Claims. (Cl. 250—20)

This invention relates to circuits and apparatus for automatic search receivers for the reception of pulse and other intermittent signals.

More specifically it relates to means for utilizing the output of two or more tuning channels to provide for continuous searching for signals over a wide range of frequencies which is divided into separate tuning channels.

Heretofore the ranges covered by search receiving apparatus have been limited by problems in designing practical tuning circuits to cover a wide range of frequencies. The expedient of dividing the entire range to be searched into separate channels, each channel having its separate tuning circuit, has not previously proved successful because of difficulties encountered in switching the circuits comprising the separate channels into succeeding common circuits for amplification and indication.

It is an object of the present invention to provide means for switching signals received on several independent tuning channels into subsequent circuits of a search receiver without undesirable interaction between said channels and to accomplish continuous scanning over the entire frequency range. This is accomplished by an arrangement in which the output of all the tuning channels are at all times connected to the succeeding circuits of the receiving apparatus but at any instant all but one of these outputs are short circuited out of the succeeding circuits and any signals present therein are by-passed to ground. Successively, the output of each of the tuning channels is allowed to enter into the succeeding circuits.

Figure 1:
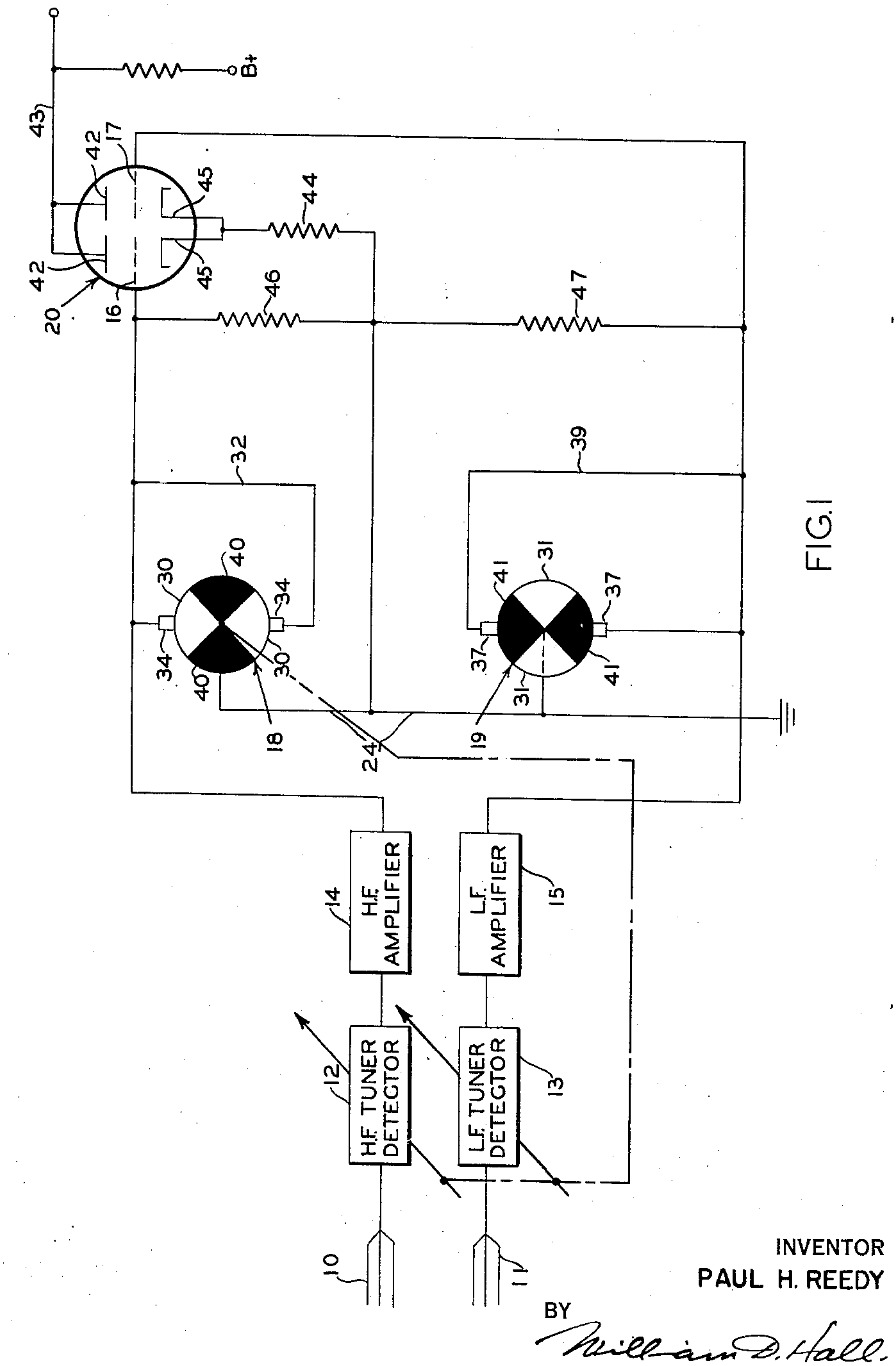
Figure 2:
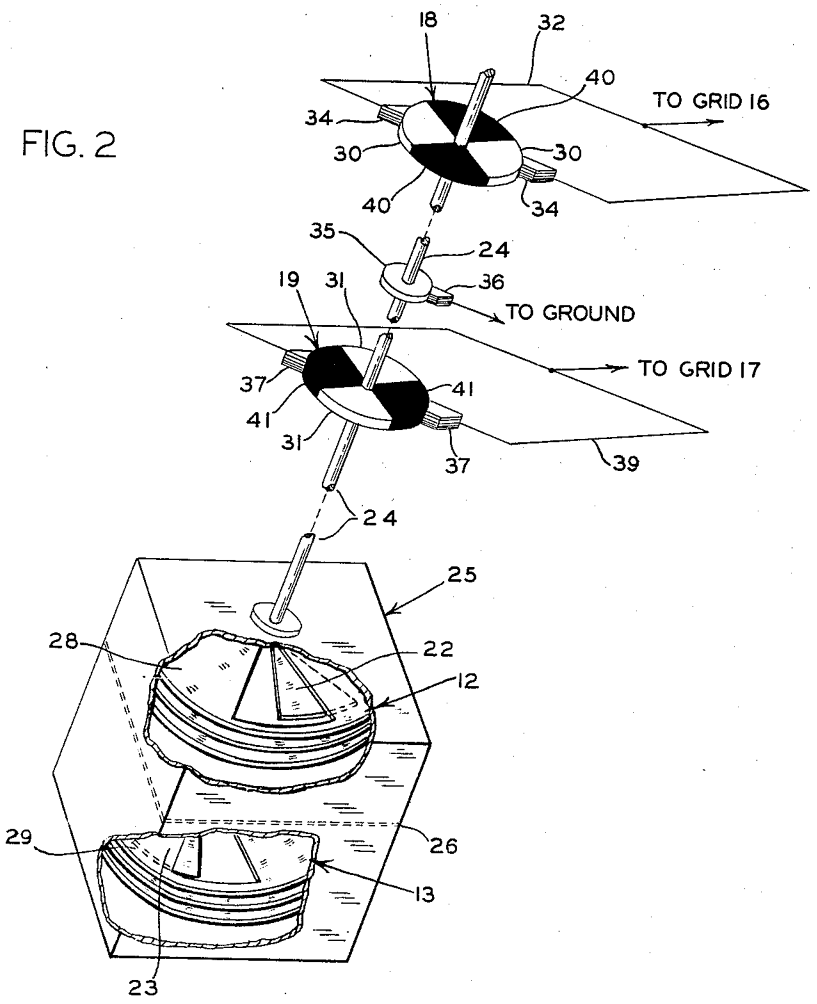

Other objects, features, and advantages will be apparent to those skilled in the art from the following description of the invention taken in connection with the accompanying drawings in which:

Fig. 1 is a circuit diagram showing a preferred embodiment of the invention; and Fig. 2 is a diagrammatic exploded isometric view of a preferred embodiment of the tuning elements, switching means, and apparatus mechanically and electrically associated with them.

The apparatus as shown in the drawings and as described in this specification has only two tuning channels provided with automatic tuning elements. However, it will be clear to those skilled in the art that the number of channels may readily be increased when it is desired to cover an extremely wide range of frequencies or to divide a particular range into narrower channels.

The arrangement and general operation of the circuits and apparatus embodying the principles of the invention may be understood by a brief description related to Fig. 1. The frequency range to be covered is divided into two channels, the high frequency channel including antenna 10, high frequency tuner and detector 12, high frequency amplifier 14, input grid 16 of collector tube 20, and commutator disc 18 and the low frequency channel including antenna 11, low frequency tuner and detector 13, low frequency amplifier 15, input grid 17 of collector tube 20, and commutator disc 19. Each of the tuners 12 and 13 includes an automatically and continuously variable tuning element such as a rotating plate variable condenser. The rotating plates of each of these condensers are mounted on the same shaft and also mounted thereon are the commutator discs 18 and 19. The condensers are designed so that the variation of each completely covers the channel for which it is designed and so that the channels covered are successively and continuously scanned. Signals received in these channels are detected, amplified, and introduced on the respective grids of collector tube 20. The commutator, in a way to be described more in detail hereinbelow, at a given time short circuits to ground all but one of the grid circuits of tube 20 so that there remains in the circuits of that tube and in the succeeding circuits only signals resulting from detection in one channel.

It is to be noted that the function of the commutator is solely to successively by-pass unwanted signals to ground and that it performs no function in switching any of the tuning or amplifying circuits into the receiver. It is an important feature of the invention that all operations performed by the commutator are at ground potential. There is, therefore, no possibility of the commutator introducing noise or other disturbing effects into succeeding circuits.

The general principles of the invention have been described in the preceding paragraphs. A detailed description of the circuits and apparatus employing the invention may be understood with reference to both Figs. 1 and 2.

The antennas 10 and 11 are each designed to function with efficiency over the channel for which it is respectively to operate. They may be of any conventional design suitable for the operating range of frequencies and for the equipment on which they are to be mounted. Connections from the antennas to the receiver proper are made by any usual means such as concentric transmission lines.

Both the high frequency tuner and detector 12 and the low frequency tuner and detector 13 are of the same general design. In practice there has been used the butterfly type of tuning circuit, the essential design of which is described at length in The General Radio Experimenter, vol. XIX No. 5, October 1944. These circuits include a multiplate condenser having stator plates and rotor plates in which the amount of capacity is dependent upon the overlapping area between interleaved stator and rotor plates. Generally both the rotor and stator plates are divided into two portions each covering less than a quadrant or 90° instead of having one semicircular portion. The inductance is obtained from inductance rings which comprise a circumferential extension of the stator plate portions. In designing the butterfly circuits for apparatus employing the present invention the size, shape, and spacing, of plates of the condensers are selected to give a good compromise between frequency coverage, linear frequency scale, and absence of undesirable electrical modes. The tuning circuits are designed so that there is no gap between the frequencies covered by adjacent channels and so that there is a minimum of overlap.

From the standpoint of the present invention, the essential feature of the butterfly circuits 12 and 13 (Fig. 2) is that the rotor plates 22 and 23 of each condenser are mounted on and rotate with a common shaft 24. The complete butterfly circuits and their associated detectors may be assembled in a shielding container 25 (Fig. 2). The two circuits should be shielded from each other by a shielding partition 26. In practice it has been found that crystals of silica or any other suitable mineral if properly chosen give adequate performance as detectors. The criteria in selecting crystals for this use are good front to back resistance ratio, high sensitivity, and proper value of impedance to match the circuits involved. These crystals rectify the incoming signals in their respective channels, all carrier and other radio frequency components are filtered out by circuits conventionally designed for that purpose, and amplifiers 14 and 15 (Fig. 1) amplify only the rectified signals received in their respective channels.

Shaft 24 is driven continuously in a single direction of rotation by a motor, not shown. It may also be arranged to be turned manually. The respective angular position of rotor plates 22 and 23 about shaft 24 and their relation to their respective stator plates 28 and 29 is such that when the rotor plates of the low frequency tuner 13 completely interleave the stator plates of that tuner, the rotor plates of the high frequency tuner 12 are not interleaved with the stator plates of that tuner. The individual portions of neither the rotor nor the stator plates are a full quadrant or 90°. This reduction in the angular dimension of the plates is necessary to provide periods during each rotation of the shaft for one set of rotor plates to pass beyond its completely interleaved position before the other set starts to interleave its stator plates. During such period no signals are received and, as will later be described, the commutator short circuits all signals off collector tube 20.

The physical arrangement of the commutator is shown in Fig. 2 and the electrical connections are shown schematically in Fig. 1 in which figures corresponding elements bear the same reference numerals. Commutator discs 18 and 19 are mounted on an extension of shaft 24 which is grounded. Each commutator disc 18 and 19 consists of two conducting segments and two insulated segments. The conducting segments 30, 30 of disc 18 are connected by conductor 32 in the circuit of high frequency grid 16 of collector tube 20 when in contact with its set of brushes 34, 34. Segments 30, 30 are in electrical contact with shaft 24. Also mounted on shaft 24 and in electrical contact therewith is slip ring 35, which is connected to ground through its brush 36. Thus when segments 30, 30 are in contact with brushes 34, 34 the circuit of grid 16 is directly connected to ground. Similarly at another position of rotation of shaft 24 conducting segments 31, 31 of disc 19 connect the circuit of low frequency grid 17 of collector tube 20 to ground through the segments 31, 31, brushes 37, 37, conductor 39, shaft 24, slip ring 35, and brush 36.

When insulated segments 40, 40 of disc 18 are in contact with brushes 34, 34 high frequency grid 16 of collector tube 20 is insulated from ground and any signals present thereon will not be by-passed to ground but will be amplified in tube 20 and will pass on through the succeeding circuits of the receiver. Likewise, when insulated segments 41, 41 of disc 19 are in contact with brushes 37, 37 signals on low frequency grid 17 of collector tube 20 will not be by-passed but will be subsequently amplified and used as desired.

The angular positions of discs 18 and 19 are such that conducting segments 30, 30 of disc 18 are in contact with brushes 34 when rotor plates 23 of the low frequency tuner 13 are entering their interleaved position relative to their respective stator plates 29 and conducting segments 31, 31 of disc 19 are in contact with brushes 37, 37 when rotor plates 22 of the high frequency tuner 12 are entering their interleaved position relative to their respective stator plates 28.

In actual practice each of the conducting segments 30, 30 and 31, 31 extend more than 90°. This overlap is to provide the periods, above mentioned, when one set of rotor plates starts to withdraw from its fully interleaved position with respect to its associated set of stator plates. During such periods both conducting segments 30, 30 and 31, 31 are in contact with their respective brushes 34, 34 and 37, 37 and all signals are bypassed to ground from the grid circuits of collector tube 20.

Both brushes 34, 34 and 37, 37 and commutator discs 18 and 19 are made independently adjustable around shaft 24 to ensure that contacts between the commutator segments and the brushes occur at the right time and continue for the proper duration during the periods of rotation of shaft 24. Once these adjustments are made for a given piece of apparatus it is generally unnecessary to make further adjustments.

Collector tube 20 as shown is a dual triode with its plates 42, 42 connected together to form a common plate circuit 43. Any arrangement of amplifying tubes may be used such as individual tubes with their plate circuits connected to form a common circuit. The essential features are an independent grid for each frequency channel and all plate circuits collected into a common circuit. Tube 20 operates as a conventional amplifier but due to the action of the commutator amplifies signals in but one channel at a time. The value of resistor 44 connected between cathodes 45, 45 is chosen to provide a biasing potential of proper value. Resistors 46 and 47 are connected respectively between grids 16 and 17 and ground.

It will now be seen that the device herein disclosed provides means for continuously searching for and receiving signals over a wider band of frequencies than has heretofore been accomplished by a single receiver and that this is accomplished by dividing the range to be covered into a plurality of channels and providing independent tuning, detecting, and amplifying means for each channel followed by means for singly and successively amplifying and utilizing the signals received in each of said channels.

Since all commutating and switching operations are accomplished at ground potential, no noise or other disturbances are introduced from those elements.

It is obvious, if it is so desired, that the range of frequencies to be covered by this search apparatus may be greatly extended by dividing it up into more than two independent tuning channels and designing the tuning circuits and commutator accordingly and as taught by this specification.

While apparatus employing the principles of this invention was developed with and is of particular use in connection with the receiving apparatus described and claimed in the application of Dr. Peter C. Goldmark, Serial No. 609,645, filed concurrently with this application of the 8th day of August 1945, it has many other useful applications which will be obvious to those skilled in the art and various changes and modifications may be made from the preferred embodiment described herein without departing from the scope of the invention.

What is claimed is:

1. A radio frequency search apparatus comprising a tuner section including a plurality of separate frequency channels, each of said channels including a tuning element adapted to cover a different portion of the frequency range to be searched, a translating section having a plurality of independent input circuits and a single output circuit, a fixed connection between each of the channels of said tuner section and one of said input circuits of said translating section, and a separate adjustable means electrically connected to each of said fixed connections for successively short-circuiting out of said translating section all but one of said channels at a time whereby the output signals of said channels are singly and successively translated.

2. A radio frequency search apparatus comprising a tuner section including a plurality of separate frequency channels, each of said channels including an adjustable tuning device adapted to cover a different portion of the frequency range to be searched, a translating section having a plurality of independent input circuits and a single output circuit, a fixed connection between each of said channels of said tuner section and one of said input circuits of said translating section, a short-circuiting switch connected to each of said fixed connections, and means connected to all of said switches and to all of said devices for continuously tuning said channels in succession through their respective portions of the frequency range to be searched and simultaneously successively short-circuiting out of said translating section all of said channels except the one being tuned through its frequency range.

3. A radio frequency search apparatus comprising a tuner section including a plurality of separate frequency channels, each of said channels including a tuning device adapted to cover a different portion of the frequency range to be searched, each of said tuning devices including a reactance and a rotary element for varying said reactance, a translating section including a single output circuit and a plurality of independent input circuits one corresponding to each of said channels, a fixed connection between each of said channels and one of said input circuits, a plurality of discs having conducting and insulating sectors and each being connected across one of said input circuits of said translating section, and a rotatable means connected to said rotary elements of said tuning devices and to said discs for successively tuning each of said channels through its portion of the frequency range to be searched and for simultaneously short-circuiting all of said input circuits except the input circuit connected to the channel being tuned.

PAUL H. REEDY.

REFERENCES CITED

The following references are of record in the file of this patent:

UNITED STATES PATENTS

| Number | Name | Date |
|---|---|---|
| 1,958,031 | Bresson | May 8, 1934 |
| 2,021,692 | Lewis | Nov. 19, 1935 |
| 2,025,645 | Carpenter | Dec. 24, 1935 |
| 2,173,898 | Conron et al. | Sept. 26, 1939 |
| 2,279,246 | Podliasky et al. | Apr. 7, 1942 |
| 2,303,214 | Labin et al. | Nov. 24, 1942 |
| 2,323,924 | Mayer | July 13, 1943 |
| 2,378,604 | Wallace | June 19, 1945 |
| 2,414,460 | Frink | Jan. 21, 1947 |